United States Patent
Yamamoto et al.

(10) Patent No.: US 7,037,870 B2
(45) Date of Patent: May 2, 2006

(54) CERAMIC SINTERED BODY AND PROCESS FOR PRODUCING THE SAME

(75) Inventors: Hiroshi Yamamoto, Kounan (JP); Eiji Miura, Komaki (JP); Takeshi Mitsuoka, Kounan (JP); Kazuhiro Urashima, Kounan (JP)

(73) Assignee: NGK Spark Plug Co., Ltd., Aichi (JP)

( * ) Notice: Subject to any disclaimer, the term of this patent is extended or adjusted under 35 U.S.C. 154(b) by 0 days.

(21) Appl. No.: 10/353,989

(22) Filed: Jan. 30, 2003

(65) Prior Publication Data

US 2003/0181310 A1    Sep. 25, 2003

(30) Foreign Application Priority Data

Jan. 31, 2002    (JP) .......................... P.2002-024390

(51) Int. Cl.
*C04B 35/195*    (2006.01)

(52) U.S. Cl. ...................... 501/120; 501/122; 501/128; 501/133; 501/153; 501/154; 279/3; 279/128

(58) Field of Classification Search ................ 501/119, 501/120, 122, 128, 133, 153, 154; 279/3, 279/128

See application file for complete search history.

(56) References Cited

U.S. PATENT DOCUMENTS

| | | | |
|---|---|---|---|
| 5,030,592 A | | 7/1991 | Komarneni et al. |
| 5,529,732 A | * | 6/1996 | Ideguchi et al. ............. 264/607 |
| 6,004,501 A | * | 12/1999 | Cornelius et al. ........... 264/631 |
| 6,265,334 B1 | | 7/2001 | Sechi et al. |

FOREIGN PATENT DOCUMENTS

| | | |
|---|---|---|
| EP | 0 458 286 | 11/1991 |
| JP | 10-53460 | 2/1998 |
| JP | 11-209171 | 8/1999 |
| JP | 2001-302341 | 10/2001 |

OTHER PUBLICATIONS

Lewis, Hawley's Condensed Chemical Dictionary, p. 800, 1993.*

Camerucci M A, et al. "Slip Casting of Cordierite and Cordierite-Mullite Materials" Journal of the European Ceramic Society Elsevier Science Publishers, Barking, Essex, GB vol. 18, No. 14 (Dec. 1, 1988, pp. 2149-2157).

* cited by examiner

*Primary Examiner*—David Sample
(74) *Attorney, Agent, or Firm*—Sughrue Mion, PLLC (57) ABSTRACT

A ceramic sintered body comprising from 90 to 99.8% by volume of cordierite and from 0.2 to 10% by volume of mullite based on 100% by weight of a total sum of the contents of the cordierite and the mullite, and having a density of 2.48 g/cm$^3$ or more.

7 Claims, 4 Drawing Sheets

CERAMIC SINTERED BODY AND PROCESS FOR PRODUCING THE SAME

FIELD OF THE INVENTION

The present invention relates a ceramic sintered body and a process of producing the same. More specifically, the invention relates to a ceramic sintered body comprising cordierite having a specified amount of mullite dispersed therein, the mullite being low in thermal expansion and having a large value obtained by dividing a Young's modulus by a density (hereinafter referred to "specific rigidity"), and to a process of producing the same.

The invention is utilized for, for example, ceramic parts for semi-conductor manufacture devices, ceramic parts for precision control machines, ceramic parts for optical instruments, and catalyst carriers.

BACKGROUND OF THE INVENTION

Hitherto, as low thermal expansion ceramic sintered bodies are known aluminum titanate, lithium alumino-silicate-based ceramics such as eucryptite, β-spondumene, and petalite, and magnesium alumino-silicate-based ceramics such as cordierite.

Though the aluminum titanate and the lithium alumino-silicate-based ceramics have a small thermal expansion coefficient, they have a small Young's modulus so that they are liable to deform by an external force or gravity. Accordingly, their application to precision machine parts or optical instrument parts in which dimensional changes or shape changes are disliked.

On the other hand, the cordierite has hitherto been applied as a low thermal expansion ceramic sintered body to filters, honeycombs, and refractories. However, this is a porous body, and its Young's modulus is low as from about 70 to 90 Gpa. Further, its thermal expansion coefficient is about 0.5 ppm/K, and it cannot be said that this value is sufficiently small.

Hitherto, in order to obtain a minute cordierite having a small thermal coefficient, there is known a method for making a petalite phase or a β-spodumene phase coexistent (see JP-A-11-209171 (the term "JP-A" as used herein means an "unexamined published Japanese patent application")). However, according to this method, cordierite sintered bodies having a sufficiently small thermal coefficient are not obtained. Further, there is known a technology in which a rare earth element is added in order to obtain a cordierite sintered body having a small porosity and a small thermal expansion coefficient (see JP-A-10-53460). However, even in this case, it cannot be said that the thermal expansion coefficient is sufficiently small.

SUMMARY OF THE INVENTION

The invention is to solve the foregoing problems of the related art and is aimed to provide a ceramic sintered body that is low in thermal expansion and has a high specific rigidity and a process of producing the same.

In one aspect, the ceramic sintered body according to the invention comprises from 90 to 99.8% by volume of cordierite and from 0.2 to 10% by volume of mullite based on 100% by weight of the total sum of the contents of the cordierite and the mullite, and having a density of 2.48 g/cm³ or more.

In another aspect, the ceramic sintered body according to the invention comprises cordierite and mullite, has a value of C, as defined by the following equation (1):

$$C = (A/B) \times 100 \tag{1}$$

wherein, when measured by the X-ray diffraction, A represents a peak intensity value of the (110) plane of mullite crystal, and B represents a peak intensity value of the (110) plane of cordierite crystal, of from 0.2 to 20 (the value C being hereinafter referred to as "peak intensity ratio"), and has a density of 2.48 g/cm³ or more.

According to the both aspects, the invention can provide a ceramic sintered body having a mean particle size of cordierite crystal of 2 μm or less.

In addition, the invention can provide a ceramic sintered body has a thermal expansion coefficient, as measured at 20 to 25° C., of from −0.2 to 0.2 ppm/K and a specific rigidity of 54.3 Gpa/g/cm³ or more.

The ceramic sintered body according to the invention can suitably be used as a member for semi-conductor manufacture device.

The ceramic sintered body according to the invention can suitably be used as a member for vacuum chuck (constituted of a ceramic sintered body).

The ceramic sintered body according to the invention can suitably be used as a member for electrostatic chuck (constituted of a ceramic sintered body).

The process of producing a ceramic sintered body according to the invention comprises (1) mixing at least one of a magnesium oxide powder and a magnesium compound powder that becomes magnesium oxide upon heating, at least one of an aluminum oxide powder and an aluminum compound powder that becomes aluminum oxide upon heating, and at least one of a silicon oxide powder and a silicon compound powder that becomes silicon oxide upon heating; (2) mixing two or more of composite oxide powders of magnesium, aluminum, and silicon; or (3) mixing at least one of the respective metal oxide powders and the respective metal compound powders and at least one of the metal composite oxide powders, and sintering the mixture so as to comprise from 90 to 99.8% by volume of cordierite and from 0.2 to 10% by volume of mullite based on 100% by weight of the total sum of the contents of the cordierite and the mullite.

According to this production process, it is possible to provide a ceramic sintered body having a thermal expansion coefficient, as measured at 20 to 25° C., of from −0.2 to 0.2 ppm/K and a specific rigidity of 54.3 Gpa/g/cm³ or more.

Incidentally, in the invention, the case where the thermal expansion coefficient is less than 0 ppm/K means that the sintered body thermally shrinks.

BRIEF DESCRIPTION OF THE DRAWINGS

[FIG. 1]

A graph showing the relationship between the amount of mullite as contained and the thermal expansion coefficient and the specific rigidity value.

[FIG. 2]

A chart of the X-ray diffraction of the ceramic sintered body of Example 3.

[FIG. 3]

A perspective view to show a partially broken section of a semi-conductor wafer and a vacuum chuck constituted of a ceramic sintered body.

[FIG. 4]

A perspective view to show a partially broken section of an electrostatic chuck device constituted of an electrostatic chuck and a base plate.

| [Description of Reference Numerals and Signs] | |
| --- | --- |
| 1: | Vacuum chuck (adsorbing plate) |
| 3, 35: | Semi-conductor wafer |
| 5: | Substrate |
| 7: | Adsorbing hole |
| 9: | Projection |
| 11: | Sealing section |
| 21: | Electrostatic chuck |
| 27: | Base plate |
| 31, 33: | Internal electrode |
| 29: | Electrostatic chuck device |

DETAILED DESCRIPTION OF THE INVENTION

The invention will be described below in detail.

In one aspect, the ceramic sintered body according to the invention comprises from 90 to 99.8% by volume of cordierite ($2MgO.2Al_2O_3.5SiO_2$) and from 0.2 to 10% by volume of mullite ($3Al_2O_3.2SiO_2$) based on 100% by weight of the total sum of the contents of the cordierite and the mullite. The content of the cordierite is from 90 to 99.8% by volume, preferably from 92 to 99.5% by volume, more preferably from 95 to 99.3% by volume, and most preferably from 95 to 99.2% by volume. When the content of cordierite is less than 90% by volume, though the specific rigidity is large, the thermal expansion coefficient is also large, and hence, such is not preferred. On the other hand, when it exceeds 99.8% by volume, since a spinel phase or a glass phase having a large thermal expansion coefficient, or a cristobalite phase having a small Young's modulus deposits, the thermal expansion coefficient becomes large, and the specific rigidity becomes small, and hence, such is not preferred, too.

The term "% by volume" as referred to herein means % by volume of each of cordierite and mullite formed by the reaction of the raw material powders during sintering based on 100% by weight of the total sum of the cordierite and the mullite.

The content of the mullite is from 0.2 to 10% by volume, preferably from 0.5 to 8% by volume, more preferably from 0.7 to 5% by volume, and most preferably from 0.8 to 5% by volume. When the content of the mullite is less than 0.2% by volume, since a spinel phase or a glass phase having a large thermal expansion coefficient, or a cristobalite phase having a small Young's modulus deposits, the thermal expansion coefficient becomes large, and the specific rigidity becomes small, and hence, such is not preferred. On the other hand, when it exceeds 10% by weight, though the specific rigidity is large, the thermal expansion coefficient is also large, and hence, such is not preferred, too. Further, preferably, in this sintered body, the crystal phase as detected by the X-ray diffraction measurement consists only of a cordierite phase and a mullite phase.

Incidentally, the sintered body can contain trace amounts of other components (inevitable impurities on the manufacture, and other components) than the cordierite and the mullite, unless the density, the thermal expansion coefficient, and the specific rigidity are influenced.

In another aspect, the ceramic sintered body according to the invention comprises cordierite and mullite and has a peak intensity ratio of from 0.2 to 20, preferably from 0.5 to 16, more preferably from 0.7 to 10, and most preferably from 0.8 to 10. When the peak intensity ratio of the ceramic sintered body is less than 0.2, since a spinel phase or a glass phase having a large thermal expansion coefficient, or a cristobalite phase having a small Young's modulus deposits, the thermal expansion coefficient becomes large, and the specific rigidity becomes small, and hence, such is not preferred. On the other hand, when it exceeds 20, though the specific rigidity is large, the thermal expansion coefficient is also large, and hence, such is not preferred, too. Further, preferably, in this sintered body, the crystal phase as detected by the X-ray diffraction measurement consists only of a cordierite phase and a mullite phase.

Incidentally, the sintered body can contain trace amounts of other components (inevitable impurities on the manufacture, and other components) than the cordierite and the mullite, unless the density, the thermal expansion coefficient, and the specific rigidity are influenced.

In the both aspects of the invention, the ceramic sintered body has a density of 2.48 $g/cm^3$ or more, preferably 2.49 $g/cm^3$ or more, and more preferably 2.50 $g/cm^3$ or more. When the density of the ceramic sintered body is less than 2.48 $g/cm^3$, a large Young's modulus is not obtained, and the specific rigidity is small, and hence, such is not preferred. Further, since the number of pores increases, when the surface of the ceramic sintered body is polished, surface smoothness is hardly obtained.

The cordierite crystal contained in the ceramic sintered body preferably has a mean particle size of 2 μm or less, more preferably 1.9 μm or less, and most preferably 1.8 μm or less. Since in the cordierite crystal, the thermal expansion coefficient on the a axis differs from that on the c axis, when the mean particle size of the cordierite crystal exceeds 2 μm, micro cracks are generated by the difference in the thermal expansion in the sintered body during the sintering step, and the specific rigidity of the resulting ceramic becomes small, and hence, such is not preferred.

The ceramic sintered body preferably has a thermal expansion coefficient, as measured at 20 to 25° C., of from −0.2 to 0.2 ppm/K, more preferably from −0.16 to 0.16 ppm/K, further preferably from −0.11 to 0.11 ppm/K, and most preferably from −0.08 to 0.08 ppm/K. Further, the ceramic sintered body preferably has a specific rigidity of 54.3 $GPg/g/cm^3$ or more, more preferably 54.6 $GPg/g/cm^3$ or more, further preferably 54.8 $GPg/g/cm^3$ or more, and most preferably 54.9 $GPg/g/cm^3$ or more. Among them, it is preferable that not only the thermal expansion coefficient is from −0.2 to 0.2 ppm/K, but also the specific rigidity is 54.3 $GPg/g/cm^3$ or more; it is more preferable that not only the thermal expansion coefficient is from −0.16 to 0.16 ppm/K, but also the specific rigidity is 54.6 $GPg/g/cm^3$ or more; it is further preferable that not only the thermal expansion coefficient is from −0.11 to 0.11 ppm/K, but also the specific rigidity is 54.8 $GPg/g/cm^3$ or more; and it is most preferable that not only the thermal expansion coefficient is from −0.08 to 0.08 ppm/K, but also the specific rigidity is 54.9 $GPg/g/cm^3$ or more.

Figure 1:
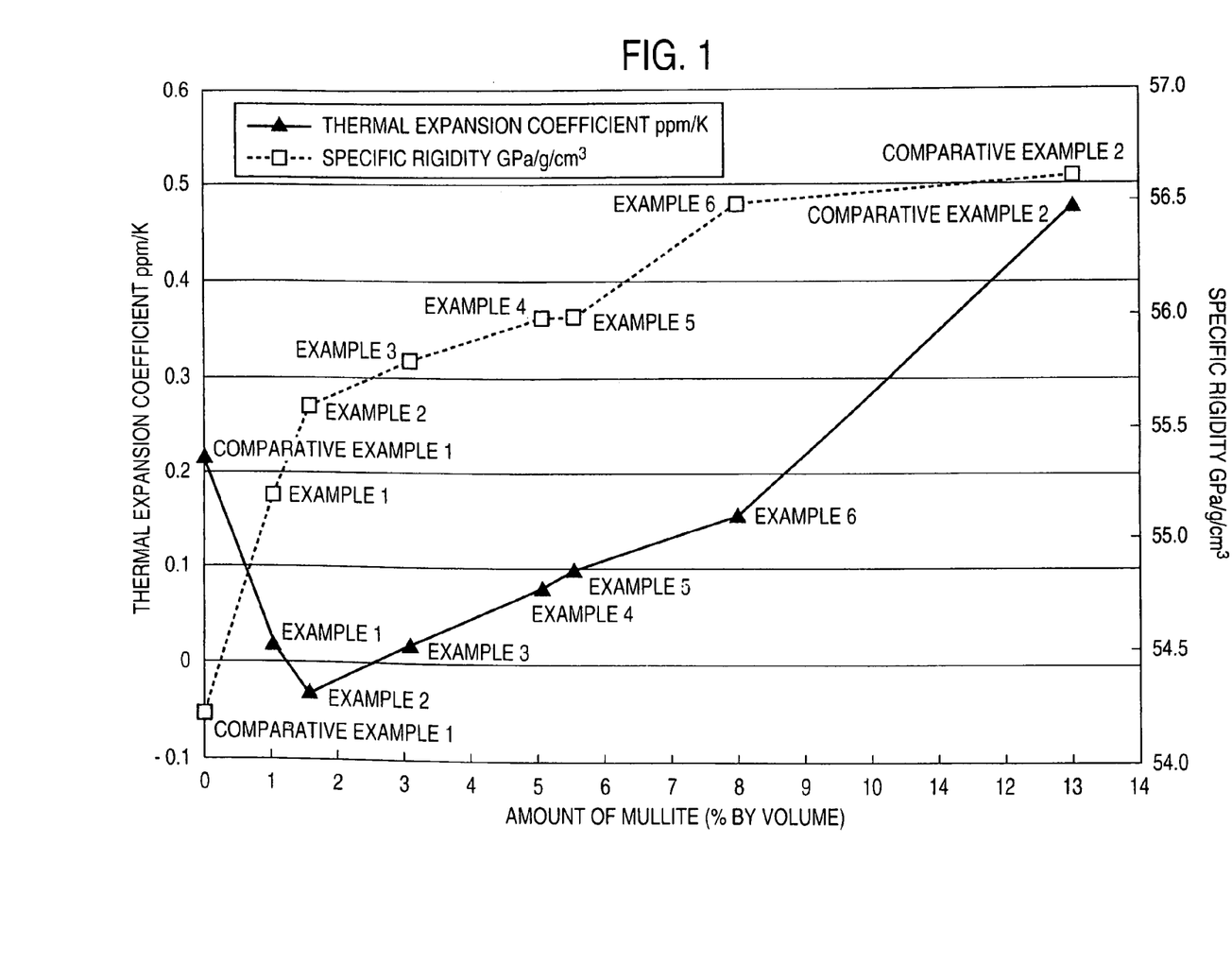

Further, with respect to the thermal expansion coefficient and the specific rigidity, as shown in FIG. 1, the following embodiments (1) to (4) are preferred depending upon the content of the mullite.

(1) In the case where the content of the mullite is from 0.2 to 10% by volume, not only the thermal expansion coefficient is from −0.03 to 0.20 ppm/K, but also the specific rigidity is from 54.4 to 56.6 $Gpa/g/cm^3$.

(2) In the case where the content of the mullite is from 0.5 to 8% by volume, not only the thermal expansion coefficient is from −0.03 to 0.16 ppm/K, but also the specific rigidity is from 54.7 to 56.5 $Gpa/g/cm^3$.

(3) In the case where the content of the mullite is from 0.7 to 5% by volume, not only the thermal expansion coefficient is from −0.03 to 0.08 ppm/K, but also the specific rigidity is from 54.9 to 56.0 Gpa/g/cm$^3$.

(4) In the case where the content of the mullite is from 0.8 to 5% by volume, not only the thermal expansion coefficient is from −0.03 to 0.08 ppm/K, but also the specific rigidity is from 55.0 to 56.0 Gpa/g/cm$^3$.

Next, the process of producing a ceramic sintered body according to the invention will be described below.

In the production process of the invention, at least one of a magnesium oxide powder and a magnesium compound powder that becomes magnesium oxide upon heating, at least one of an aluminum oxide powder and an aluminum compound powder that becomes aluminum oxide upon heating, and at least one of a silicon oxide powder and a silicon compound powder that becomes silicon oxide upon heating may be mixed and used. Each of these compounds is only required to become an oxide upon heating. As such compounds are enumerated a carbonate, a hydrogencarbonate, a hydroxide, and a nitrate of each of the metals. Further, besides the respective metal oxide powders and the respective metal compound powders, two or more of composite oxide powders of the foregoing metals (i.e., magnesium, aluminum, and silicon) may be mixed and used. As the composite oxide powders are enumerated powders of, e.g., cordierite, mullite, and other aluminosilicates. Moreover, at least one of the respective metal oxide powders and the respective metal compound powders and at least one of the metal composite oxide powders may be mixed and used. For example, one or more of powders of, e.g., cordierite, mullite, and other aluminosilicates and one or more of powders of, e.g., magnesia, magnesium carbonate, alumina, aluminum hydroxide, and silica can be used. Also, calcined powders can be used as the raw material powders.

Each of the foregoing powders preferably has a mean particle size of 2.0 μm or less, more preferably 1.9 μm or less, and most preferably 1.8 μm or less. When the particle size of the powder exceeds 2.0 μm, a sintered body having a large Young's modulus is not obtained, and the specific rigidity is small, and hence, such is not preferred. The metal oxide powders are weighed and mixed such that these powders are reacted with each other during sintering to give a sintered body comprising from 90 to 99.8% by volume of a cordierite phase and from 0.2 to 10% by volume of a mullite phase. Preferably, in this sintered body, the crystal phase as detected by the X-ray diffraction measurement consists only of the cordierite phase and the mullite phase. Incidentally, trace amounts of other raw materials (inevitable impurities on the manufacture, and other raw materials), which will constitute other phases than the cordierite phase and the mullite phase, may be mixed, unless the density, the thermal expansion coefficient, and the specific rigidity are influenced.

Thereafter, the mixture may be molded. There are no particular limitations with respect to the shape and size of the molding. Further, there are no particular limitations with respect to the molding method.

Subsequently, the molding is sintered to obtain a ceramic sintered body. The sintering is carried out preferably at from 1,300 to 1,450° C. for from 1 to 5 hours in a prescribed atmosphere. Further, the sintering atmosphere is not limited, but the sintering is preferably carried out in air. However, the sintering may be carried out in an inert gas atmosphere such as argon or in vacuo, or in a non-oxidative atmosphere such as nitrogen gas. In addition, while the sintered body is preferably obtained by sintering under atmospheric pressure, in order to obtain a more minute sintered body, the sintered body after the sintering under atmospheric pressure may be further subjected to an HIP (hot isotactic pressing) processing. Moreover, sintering under pressure, such as HP (hot press), may be employed.

To the ceramic sintered body as produced by this production process can be applied the foregoing thermal expansion coefficient and specific rigidity.

The ceramic sintered body according to the invention can be used as a member for semi-conductor manufacture device.

This enumerates one of utilities of the ceramic sintered body according to the invention.

Accordingly, when the ceramic sintered body of the invention is employed as a member of a semi-conductor manufacture device to be used for the manufacture of, for example, semi-conductor wafers, the deformation of the device by heat can be controlled so that a semi-conductor wafer having superior dimensional precision can be obtained.

The ceramic sintered body according to the invention can be used as a member for vacuum chuck.

This enumerates one of utilities of the ceramic sintered body according to the invention.

Accordingly, when the ceramic sintered body of the invention is employed as a member of a vacuum chuck to be used for the manufacture of, for example, semi-conductor wafers, the deformation of the member by heat can be controlled so that a semi-conductor wafer having superior dimensional precision can be obtained.

The ceramic sintered body according to the invention can be used as a member for electrostatic chuck.

The foregoing ceramic sintered body can also be applied to electrostatic chucks (for example, in the case where a wafer is held by using a Coulomb force).

EXAMPLES

The invention will be specifically described below with reference to the Examples.

[1] Preparation of Ceramic Sintered Body:

A commercially available cordierite powder was mixed with predetermined amounts of a magnesia powder, a silica powder, an alumina powder and a mullite powder so as to have a composition as shown in Table 1, and the mixture was wet pulverized in the presence of water as a solvent by using high-purity alumina flint pebbles (purity: 99.9% or more). After the pulverization, the powder had a mean particle size of 1.7 μm. Thereafter, a binder was added to the powder, and the mixture was spray dried. Next, the resulting mixture was molded into a predetermined shape and sintered. For all of the samples, the sintering was carried out in air under atmospheric pressure at a sintering temperature of from 1,300 to 1,450° C. for a holding time of 2 hours. There were thus obtained samples of Examples 1 to 5 and Comparative Examples 1 to 3.

Table 2 shows the amount of cordierite and the amount of mullite contained in each sample, and the sintering temperature, the density, the peak intensity ratio, the Young's modulus, the specific rigidity value, and the thermal expansion coefficient of each sample. Further, FIG. 1 shows the relationship between the amount of mullite and the thermal expansion coefficient and the specific rigidity in each of Examples 1 to 5 and Comparative Examples 1 to 3.

Incidentally, in Table 2, the term "% by volume" means % by volume of each of cordierite and mullite formed by the reaction of the raw material powders based on 100% by weight of the total sum of the cordierite and the mullite.

TABLE 1

| Sample | Amount of cordierite powder (% by weight) | Amount of magnesia powder (% by weight) | Amount of alumina powder (% by weight) | Amount of silica powder (% by weight) | Amount of mullite powder (% by weight) |
|---|---|---|---|---|---|
| Example 1 | 92.8 | 2.10 | 0 | 5.13 | 0 |
| Example 2 | 94.5 | 1.61 | 0 | 3.92 | 0 |
| Example 3 | 100 | 0 | 0 | 0 | 0 |
| Example 4 | 97.5 | 0 | 0 | 0 | 2.50 |
| Example 5 | 97.5 | 0 | 1.79 | 0.71 | 0 |
| Example 6 | 93.8 | 0 | 0 | 0 | 6.24 |
| Comparative Example 1 | 89.5 | 3.04 | 0 | 7.43 | 0 |
| Comparative Example 2 | 87.7 | 0 | 0 | 0 | 12.3 |
| Comparative Example 3 | 100 | 0 | 0 | 0 | 0 |

TABLE 2

| Sample | Amount of cordierite (% by volume) | Amount of mullite (% by volume) | Sintering temperature (°C.) | Density (g/cm$^3$) | Peak intensity ratio | Young's modulus (Gpa) | Specific rigidity (Gpa/g/cm$^3$) | Thermal expansion coefficient (ppm/K) |
|---|---|---|---|---|---|---|---|---|
| Example 1 | 99 | 1 | 1,400 | 2.50 | 1 | 138 | 55.2 | 0.02 |
| Example 2 | 98.5 | 1.5 | 1,400 | 2.50 | 3 | 139 | 55.6 | −0.03 |
| Example 3 | 97 | 3 | 1,400 | 2.51 | 6 | 140 | 55.8 | 0.02 |
| Example 4 | 95 | 5 | 1,400 | 2.52 | 10 | 141 | 56.0 | 0.08 |
| Example 5 | 94.5 | 5.5 | 1,400 | 2.52 | 11 | 141 | 56.0 | 0.10 |
| Example 6 | 92 | 8 | 1,400 | 2.53 | 16 | 143 | 56.5 | 0.16 |
| Comparative Example 1 | 100 | 0 | 1,400 | 2.49 | 0 | 135 | 54.2 | 0.22 |
| Comparative Example 2 | 87 | 13 | 1,450 | 2.56 | 30 | 145 | 56.6 | 0.48 |
| Comparative Example 3 | 97 | 3 | 1,350 | 2.37 | 6 | 120 | 50.6 | 0.06 |

[2] Evaluation of Physical Properties, Etc.:

The evaluation of the Examples and Comparative Examples as shown in Table 2 was made in the following manner.

(1) Mean Particle Size of Powder:

The particle size distribution was measured by the laser scatter method, and its 50% diameter was designated as the mean particle size.

(2) Contents of Cordierite and Mullite:

The sintered body was measured by the X-ray diffraction, and the amount of mullite was calculated by a calibration curve previously prepared from the peak intensity of the (110) plane of mullite crystal and the (110) plane of cordierite crystal. The calibration curve was prepared by preparing sintered bodies of cordierite to which mullite had been added in an amount of 0%, 5% and 10% by volume, respectively, and measuring these sintered bodies by the X-ray diffraction to determine a ratio of the peak intensity of the (110) plane of mullite crystal and the (110) plane of cordierite crystal.

Figure 2:
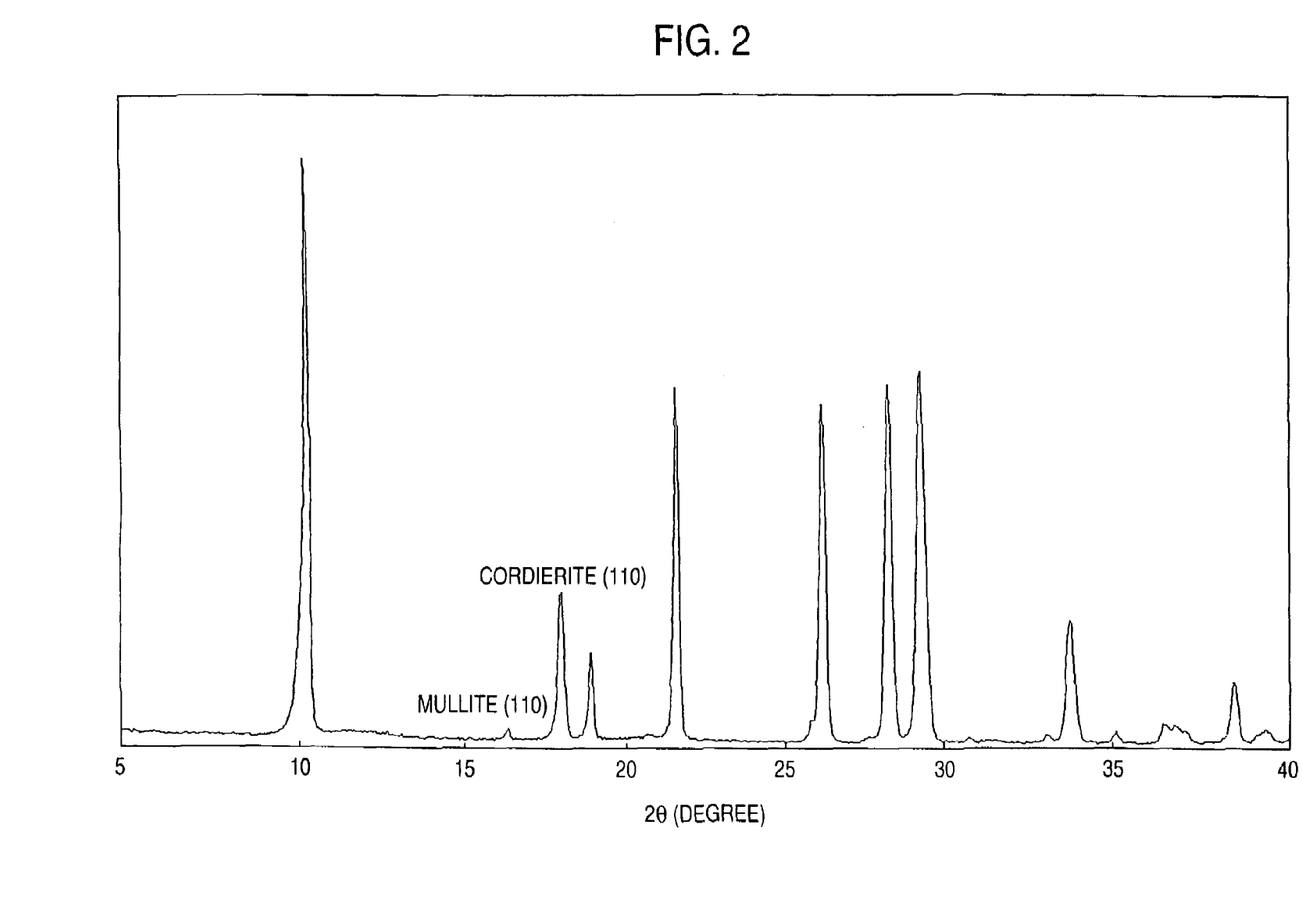

(3) Peak Intensity Ratio:

The sintered body was measured by the X-ray diffraction, and the peak intensity ratio was determined from the peak intensity of the (110) plane of the resulting cordierite crystal and the peak intensity of the (110) plane of the resulting mullite crystal according to the foregoing equation (1) (see the X-ray diffraction chart of the ceramic sintered body of Example 3 as shown in FIG. 2).

(4) Density of Sintered Body:

The evaluation was made by the Archimedes' method as defined in JIS R 1634, and the numerical value was rounded off to the second decimal place according to JIS Z 8401.

(5) Mean Particle Size of Cordierite Particles in Sintered Body:

The sintered body was mirror finished and thermally etched, and then observed by SEM (scanning electron microscope). The mean particle size was calculated from the SEM photograph by the intercept technique. The cordierite particles of each of the samples of the Examples and Comparative Examples had a mean particle size of 1.8 μm.

(6) Thermal Expansion Coefficient:

The evaluation was made by the laser interferometry as defined in JIS R 3251, thereby calculating a mean thermal expansion coefficient at 20 to 25° C.

(7) Specific Rigidity:

The specific rigidity was calculated by dividing the value of the Young's modulus by the density.

Further, the Young's modulus was measured at room temperature by the ultrasonic pulse technique as defined in JIS R 1602.

[3] Effects of the Examples:

As shown in FIG. 1 and Table 2, in Comparative Example 1 (ceramic sintered body consisting only of cordierite, which is free from mullite) and Comparative Example 2 (ceramic sintered body consisting of 87% by volume of cordierite and 13% by volume of mullite), the thermal expansion coefficient is large as 0.22 ppm/K and 0.48 ppm/K, respectively. In particular, in Comparative Example 2, the thermal expansion coefficient is very large. Further, the specific rigidity is 54.2 Gpa/g/cm$^3$ and 56.6 Gpa/g/cm$^3$, respectively, and especially, it can be understood that in Comparative Example 1, the specific rigidity is small. In addition, according to Table 2, in Comparative Example 3 (ceramic sintered body consisting of 97% by volume of cordierite and 3% by volume of mullite and having a small density as 2.37 g/cm$^3$), though the thermal expansion coefficient is small as 0.06 ppm/K, the specific rigidity is very small as 50.6 Gpa/g/cm$^3$.

In contrast, as shown in FIG. 1 and Table 2, in Examples 1 to 6, the thermal expansion coefficient is small as from −0.03 to 0.16 ppm/K. Especially, in Examples 1 to 5, the thermal expansion coefficient is small as from −0.03 to 0.10 ppm/K, the values of which are very small as from about 1/10 to 1/3 of that in Comparative Example 1. In particular, in Examples 1 and 3, the thermal expansion coefficient is extremely small as about 1/10 of that in Comparative Example 1. That is, in Example 1 (a small amount (1% by volume) of mullite is added to cordierite) and Example 3 (a small amount (3% by volume) of mullite is added to cordierite), the thermal expansion coefficient is abruptly small as 0.02 ppm/K as compared with that (0.22 ppm/K) of Comparative Example 1.

In addition, in Examples 1 to 6, the specific rigidity is large as from 55.2 to 56.5 Gpa/g/cm$^3$ as compared with that in Comparative Example 1.

In the light of the above, it can be understood that the ceramic sintered bodies of Examples 1 to 5 have a superior thermal expansion coefficient and a specific rigidity and are quite superior in balance between the both. Further, as shown in FIG. 1, the thermal expansion coefficient is approximately curved having a downward convex shape, and exhibits an unexpected behavior.

The Examples give rise to unexpected effects from the related art such that the thermal expansion coefficient is small, and the specific rigidity is large, as compared with the conventionally known cordierite. It may be considered that these effects are brought by the following reasons. That is, the formation region of the cordierite is very narrow, and even a little deviation in the composition results in deposition of a second phase. Accordingly, when the composition of the cordierite sintered body is deviated a little to the mullite formation side, the deposition of a phase having a small Young's modulus and a large thermal expansion coefficient is controlled so that it becomes possible to stably produce a sintered body having a small thermal expansion coefficient and a large Young's modulus. Incidentally, even when it is intended to form a single phase of cordierite, a glass phase and the like are inevitably formed, so that the single phase of cordierite cannot be stably formed, and the thermal expansion coefficient becomes large.

[4] Applications of the Examples:

Since the ceramic sintered body according to the invention contains cordierite having a low thermal expansion coefficient as the major component, the thermal expansion coefficient of the whole of the ceramic sintered body is extremely low, and the dimensional change and the shape change with the temperature change are little. Moreover, by sintering the materials constituting the ceramic sintered body, it is possible to obtain a ceramic sintered body having not only a high density but also a high specific rigidity.

Accordingly, by using the ceramic sintered body according to the invention, there gives rise to a marked effect for enabling to provide ceramic parts that are little in the dimensional change and the shape change with the temperature change and high in the rigidity, such as ceramic parts that can be suitably used for, for example, semi-conductor manufacture devices, precision control machines, optical instruments, and catalyst carriers.

Next, the utilities of the ceramic member comprising the ceramic sintered body according to the invention will be described below.

(1) First, a vacuum chuck using the ceramic sintered body having the constitution of the foregoing Examples and a semi-conductor manufacture device using the vacuum chuck will be shown.

Figure 3:
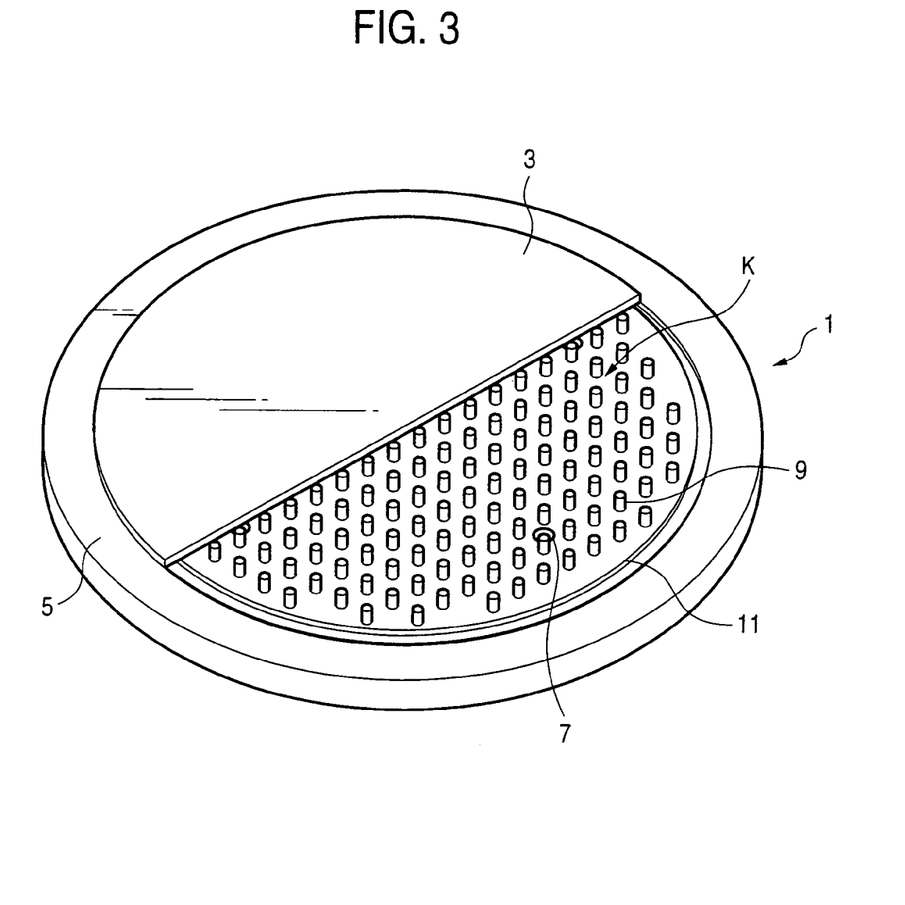

As shown in FIG. 3, a vacuum chuck 1 is a disc-like adsorbing plate that adsorbs a semi-conductor wafer 3 by a suction force by the reduced pressure and holds it.

The vacuum chuck 1 is provided with a disc-like substrate 5, adsorbing holes 7 penetrating through the substrate 5 in the thickness direction (for reducing the pressure), a number of projections 9 protruding to the side of an adsorbing surface K of the substrate 5 (the side of the semi-conductor wafer 3), and a sealing section 11 protruding such that it circularly encircles the surrounding of the projections 9.

The vacuum chuck 1 is installed in a well-known polishing machine (not shown) constituting a part of the semi-conductor device and used. The polishing machine is a CMP (chemical mechanical polishing) device for undergoing CMP against the semi-conductor wafer 3 and is mainly configured of a rotatably aligned platen and a polishing head aligned at the upper side of the platen as a vacuum suction device.

In the polishing machine, the vacuum chuck 1 is installed in the polishing head, and a vacuum pump is actuated to reduce the air pressure of a vacuum space within the polishing head. Thus, a difference in the air pressure inside and outside the adsorbing holes 7 of the vacuum chuck 1 is generated, thereby adsorbing the semi-conductor wafer 3 onto adsorbing surface K of the vacuum chuck 1.

Next, in a state where the semi-conductor wafer 3 is disposed between a polishing pad of the platen and the vacuum chuck 1, a slurry for CMP is fed to the surface of the polishing pad, and the platen and the polishing head are rotated to undergo polishing of the surface of the semi-conductor wafer 3.

As described above, since the vacuum chuck 1 is constituted of the ceramic sintered body having the forgoing properties, has low thermal expansion properties and a high rigidity, and is little in the dimensional change and the shape change with the temperature change, it can produce the semi-conductor wafer 3 having high dimensional precision.

(2) Next, an electrostatic chuck using the ceramic sintered body having the constitution of the foregoing Examples as another application will be described.

Figure 4:
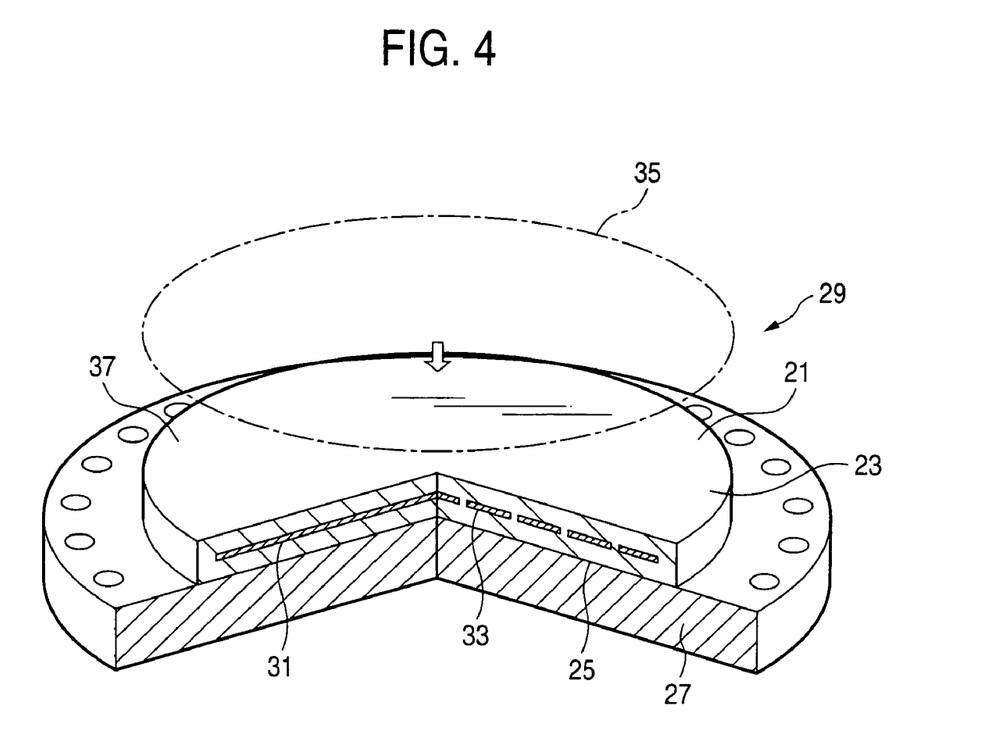

As shown in FIG. 4, an electrostatic chuck 21 contains a disc-like member comprising the foregoing ceramic sintered body as a substrate 23, and a metal-made disc-like base plate 27 is welded to one surface of the electrostatic chuck 21 (the back surface in the lower portion of FIG. 4) via a welding layer 25. Incidentally, the assembly comprising the electrostatic chuck 21 having the base plate 27 welded thereto is called an electrostatic chuck device 29.

A pair of internal electrodes 31, 33 are embedded inside the electrostatic chuck 21 (i.e., inside the substrate 23). The other surface of the electrostatic chuck 21 (the front surface in the upper portion of FIG. 4) constitutes an adsorbing surface (chuck surface) 37 for, for example, adsorbing and fixing a semi-conductor wafer 35 thereto.

Incidentally, through-holes (not shown) may be provided such that they penetrate through the electrostatic chuck 21 and the base plate 27 in the vertical direction in FIG. 4, through which are fed an He gas for cooling at the side of the chuck surface 37.

A direct-current voltage of about ±1,000 V is applied to the electrostatic chuck 21 to generate a Coulomb force for adsorbing the semi-conductor wafer 35, and using this adsorbing force, the semi-conductor wafer 35 is adsorbed and fixed.

As described above, since the electrostatic chuck 21 is constituted of the ceramic sintered body having the forgoing properties and is little in the dimensional change and the shape change with the temperature change, it can produce the semi-conductor wafer 35 having high dimensional precision.

In the light of the above, as compared with the cordierite-based ceramics of the related art, the ceramic sintered body according to the invention has a small thermal expansion coefficient and has a large specific rigidity, while keeping a good balance between the both. Accordingly, the ceramic sintered body according to the invention can be suitably utilized for parts of precision control machines and parts of optical instruments that are required to have low thermal expansion properties and a high specific rigidity, or parts that are required to have high resistance to thermal shock.

In addition, according to the production process of the invention, ceramic sintered bodies having a small thermal expansion coefficient and a large specific rigidity can be easily produced.

This application is based on Japanese Patent application JP 2002-24390, filed Jan. 31, 2002, the entire content of which is hereby incorporated by reference, the same as if set forth at length.

What is claimed is:

1. A ceramic sintered body comprising from 92 to 99.5% by volume of cordierite and from 0.5 to 8% by volume of mullite based on 100% by weight of a total sum of the contents of the cordierite and the mullite, wherein the crystal phase of said sintered body detected by x-ray diffraction measurements consists only of a cordierite phase and a mullite phase including inevitable impurities, and having a density of 2.48 g/cm$^3$ or more, wherein the cordierite crystal has a mean particle size of 2 μm or less, and wherein said ceramic sintered body has a thermal expansion coefficient, as measured at 20 to 25° C., of from −0.03 to 0.16 ppm/K and a value, as obtained by dividing a Young's modulus by the density, of 54.7 to 56.5 Gpa/g/cm$^3$ or more.

2. A semi-conductor manufacture device comprising the ceramic sintered body according to claim 1.

3. A vacuum chuck comprising the ceramic sintered body according to claim 1.

4. An electrostatic chuck comprising the ceramic sintered body according to claim 1.

5. A process for producing a ceramic sintered body according to claim 1, which comprises:

mixing at least one of a magnesium oxide powder, and a magnesium compound powder that becomes magnesium oxide upon heating, an aluminum oxide powder, an aluminum compound powder that becomes aluminum oxide upon heating, a silicon oxide powder and a silicon compound powder that becomes silicon oxide upon heating, and at least one of composite oxide powders of magnesium, aluminum and silicon; and sintering the mixture so as to comprise from 92 to 99.5% by volume of cordierite and from 0.5 to 8% by volume of mullite based on 100% by weight of a total sum of the contents of the cordierite and the mullite.

6. The process according to claim 5, wherein the powders have a mean particle size of 2.0 μm or less.

7. The process according to claim 5, wherein the sintering is carried out at from 1,300 to 1,450° C. for from 1 to 5 hours.

* * * * *